(12) United States Patent
Kwon et al.

(10) Patent No.: US 8,981,543 B2
(45) Date of Patent: Mar. 17, 2015

(54) SEMICONDUCTOR PACKAGE AND METHOD OF FORMING THE SAME

(71) Applicant: Samsung Electronics Co., Ltd., Suwon-si, Gyeonggi-do (KR)

(72) Inventors: Heungkyu Kwon, Hwasung (KR); Seungjin Cheon, Hwasung (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/951,376

(22) Filed: Jul. 25, 2013

(65) Prior Publication Data
US 2014/0035137 A1 Feb. 6, 2014

(30) Foreign Application Priority Data

Jul. 31, 2012 (KR) ........................ 10-2012-0084072

(51) Int. Cl.
| | |
|---|---|
| *H01L 23/13* | (2006.01) |
| *H01L 23/00* | (2006.01) |
| *H01L 23/498* | (2006.01) |
| *H01L 23/28* | (2006.01) |

(Continued)

(52) U.S. Cl.
CPC ........ *H01L 23/562* (2013.01); *H01L 23/49816* (2013.01); *H01L 23/28* (2013.01); *H01L 25/0655* (2013.01); *H01L 25/0657* (2013.01); *H01L 25/105* (2013.01); *H01L 2224/16225* (2013.01); *H01L 2224/32225* (2013.01); *H01L 2224/48091* (2013.01); *H01L 2224/48227* (2013.01); *H01L 2224/73265* (2013.01); *H01L 2924/15311* (2013.01); *H01L 2924/18301* (2013.01); *H01L 23/3128* (2013.01); *H01L 23/3135* (2013.01); *H01L 21/565* (2013.01);

*H01L 2225/06517* (2013.01); *H01L 2225/1023* (2013.01); *H01L 2225/1058* (2013.01); *H01L 2225/1076* (2013.01); *H01L 2225/06513* (2013.01); *H01L 2225/06541* (2013.01); *H01L 2924/15151* (2013.01)

USPC ........... 257/680; 257/678; 257/687; 257/738; 257/E23.123

(58) Field of Classification Search
CPC ....... H01L 23/28; H01L 23/31; H01L 23/293; H01L 23/3121; H01L 23/3107; H01L 23/49838; H01L 2924/15151; H01L 2924/15321
USPC ................. 257/678, 680, 687, 730, 738, 787, 257/E23.116, E23.123
See application file for complete search history.

(56) References Cited

U.S. PATENT DOCUMENTS

| | | | | |
|---|---|---|---|---|
| 6,107,689 | A | * | 8/2000 | Kozono ........................ 257/778 |
| 6,400,034 | B1 | | 6/2002 | Kimura et al. |

(Continued)

FOREIGN PATENT DOCUMENTS

| | | | |
|---|---|---|---|
| JP | 2000174193 A | 6/2000 |
| JP | 2001024085 A | 1/2001 |

(Continued)

*Primary Examiner* — Eduardo A Rodela
(74) *Attorney, Agent, or Firm* — Renaissance IP Law Group LLP

(57) ABSTRACT

Semiconductor packages are disclosed. In a semiconductor package, a package board may include a hole. A mold layer may cover an upper portion of the package board and extend through the hole to cover at least a portion of a bottom surface of the package board. Each of the sidewalls of a lower mold portion may have a symmetrical structure with respect to the hole penetrating the package board, such that a warpage phenomenon of the semiconductor package may be reduced.

17 Claims, 23 Drawing Sheets

(51) Int. Cl.
  *H01L 25/065* (2006.01)
  *H01L 25/10* (2006.01)
  *H01L 23/31* (2006.01)
  *H01L 21/56* (2006.01)

(56) References Cited

U.S. PATENT DOCUMENTS

| | | | |
|---|---|---|---|
| 6,490,166 B1 | 12/2002 | Ramalingam et al. | |
| 7,960,837 B2 | 6/2011 | Inoue | |
| 2002/0043721 A1* | 4/2002 | Weber | 257/734 |
| 2004/0080043 A1* | 4/2004 | Tsai et al. | 257/723 |
| 2008/0237842 A1* | 10/2008 | Manepalli | 257/712 |
| 2009/0134504 A1 | 5/2009 | Lee et al. | |
| 2009/0152731 A1 | 6/2009 | Inoue | |
| 2010/0090326 A1 | 4/2010 | Baek et al. | |
| 2010/0224975 A1 | 9/2010 | Shin et al. | |
| 2011/0149493 A1 | 6/2011 | Kwon et al. | |
| 2011/0156178 A1 | 6/2011 | Zuniga-Ortiz et al. | |
| 2012/0139109 A1* | 6/2012 | Choi | 257/738 |
| 2014/0015072 A1* | 1/2014 | Kang | 257/418 |

FOREIGN PATENT DOCUMENTS

| | | |
|---|---|---|
| JP | 2001069987 A | 3/2001 |
| JP | 2009146969 A | 7/2009 |
| KR | 19970013244 | 3/1997 |
| KR | 20100047540 A | 5/2010 |
| KR | 20100087890 A | 8/2010 |
| KR | 20110016015 A | 2/2011 |

* cited by examiner

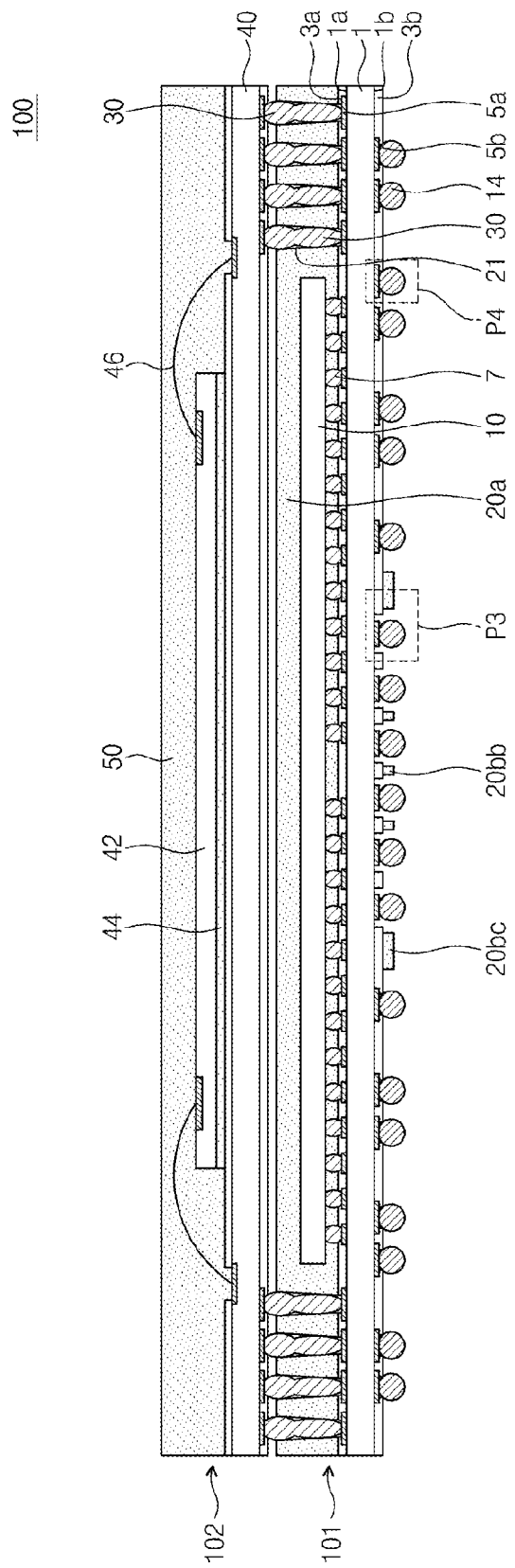

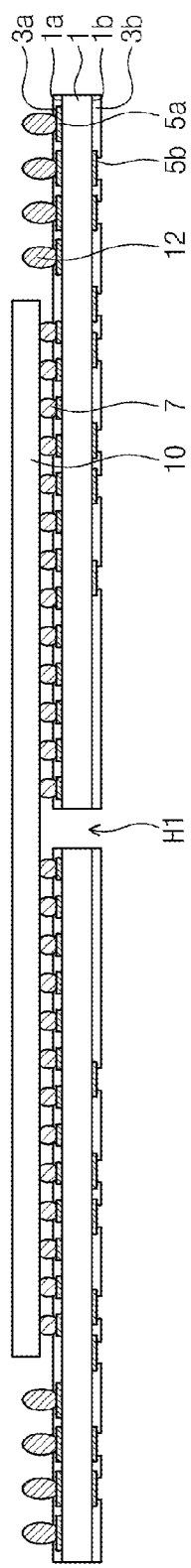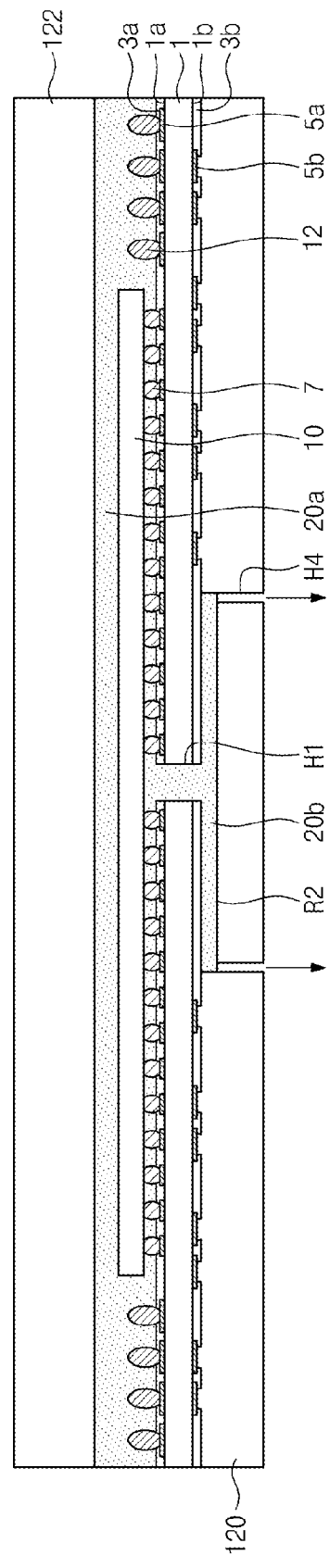

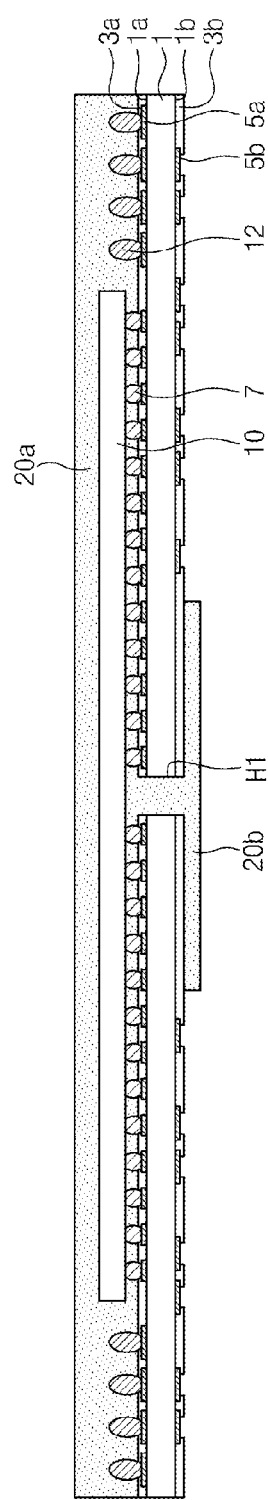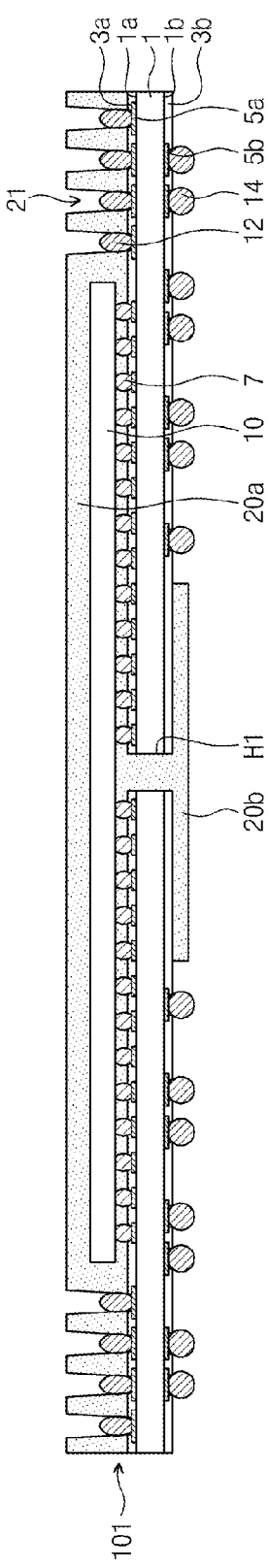

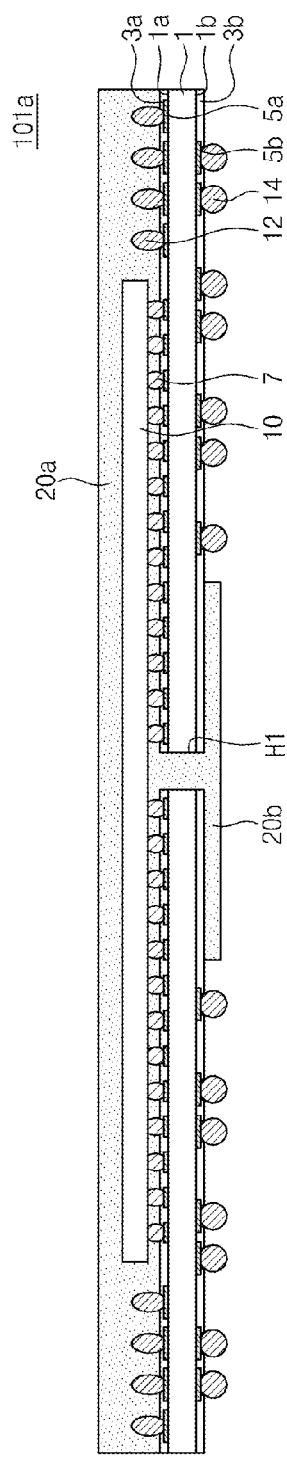
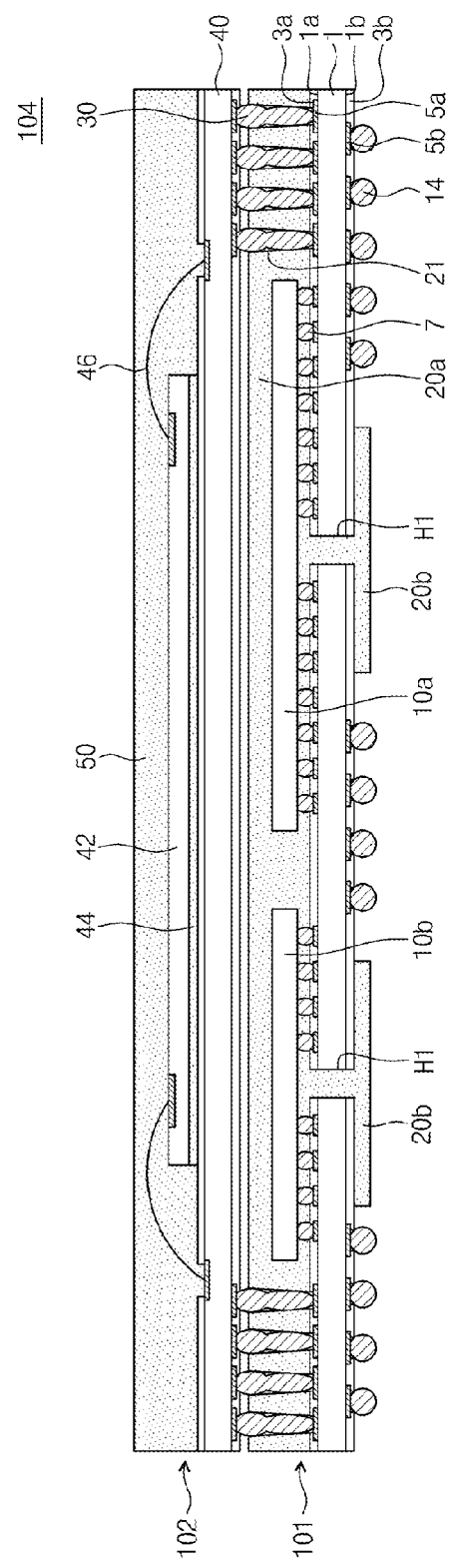

US 8,981,543 B2

SEMICONDUCTOR PACKAGE AND METHOD OF FORMING THE SAME

CROSS-REFERENCE TO RELATED APPLICATIONS

This U.S. non-provisional patent application claims priority under 35 U.S.C. §119 to Korean Patent Application No. 10-2012-0084072, filed on Jul. 31, 2012, the entirety of which is incorporated by reference herein.

BACKGROUND

The inventive concepts relate to semiconductor packages and methods of forming the same.

The electronic industry is increasingly demanding high performance, high speed, and smaller size electronic elements. Various mounting techniques have been researched for satisfying these demands. A flip chip bonding method, for instance, may provide a shorter connecting distance between pads than a wire bonding method, thereby improving a signal transmission speed. Additionally, the flip chip bonding method can prevent shorting of wires. However, a void may exist between bumps in a semiconductor package formed by the flip chip bonding method. An underfill resin layer may be formed to fill a space between the bumps for preventing the void. However, a dam may be required for preventing a flow of an underfill resin solution, and it may therefore be difficult to reduce the horizontal and vertical lengths of the semiconductor package.

SUMMARY

Embodiments of the inventive concepts may provide small, high speed semiconductor packages.

Embodiments of the inventive concepts may also provide methods of forming a semiconductor package that are capable of simplifying the manufacturing processes.

In one aspect, a semiconductor package may include a package board including at least one hole and at least one semiconductor chip mounted on the package board by a flip chip bonding method, A mold layer can also be included, said mold layer having an upper mold portion covering the at least one semiconductor chip and the package board, and a lower mold portion connected to the upper mold portion through the hole, wherein the lower mold portion covers at least a portion of a bottom surface of the package board. Lower solder balls may be disposed on the bottom surface of the package board, where the lower solder balls are not covered by the lower mold portion. Each of the outermost sidewalls of the lower mold portion may be disposed at an equal distance from a center of the hole.

According to one embodiment, the outermost sidewalls of the lower mold portion may be disposed at an equal distance from corresponding sidewalls of the package board.

The lower mold portion may include a center pattern overlapping the hole. At least one edge pattern may be spaced apart from the center pattern with lower solder balls arranged between the edge pattern and the center pattern. A plurality of connection patterns may be disposed between groups of the lower solder balls and may connect the center pattern to the edge pattern in a plan view.

In one embodiment, the center pattern may have a circular or polygonal shape having a width equal to or greater than a width of the hole.

In one embodiment, the edge pattern may have a closed-loop shape, a circular shape, or a polygonal shape.

In one embodiment, the connection pattern may have a narrower width than a width of the center pattern and a width of the edge pattern.

In an embodiment, the semiconductor package may further include a first lower conductive pattern and a second lower conductive pattern disposed on the bottom surface of the package board. The first lower conductive pattern may be bonded to the lower solder balls adjacent to the lower mold portion, and the second lower conductive pattern may be bonded to the lower solder balls adjacent to a sidewall of the package board. A lower insulating layer may be provided covering the bottom surface of the package board, wherein the lower insulating layer includes a first lower hole exposing the first lower conductive pattern and a second lower hole exposing the second lower conductive pattern. A width of the first lower conductive pattern may be smaller than a width of the first lower hole.

In one embodiment, a width of the second lower conductive pattern may be greater than a width of the second lower hole.

In one embodiment, the center pattern may protrude a greater distance from the bottom surface of the package board than at least one of the edge pattern and the connection pattern.

In one embodiment, the lower insulating layer may include a recessed region, and the lower mold portion may be disposed in the recessed region.

In one embodiment, the lower mold portion may penetrate the lower insulating layer so as to be in contact with the bottom surface of the package board.

In one embodiment, the lower mold portion may be disposed in a recessed region formed in the lower insulating layer and a portion of the package board.

In one embodiment, the lower solder balls may include first lower solder balls adjacent to the lower mold portion and second lower solder balls adjacent to a sidewall of the package board. A distance between the first lower solder balls may be greater than a distance between the second lower solder balls.

In one embodiment, the upper mold portion may fill a space between the semiconductor chip and the package board; and the upper mold portion and lower mold portion may be connected to each other without an interface, such that the upper mold portion and the lower mold portion comprise an integrated body.

In another aspect, a method of forming a semiconductor package may include mounting at least one semiconductor chip on a package substrate having at least one hole by a flip-chip bonding method. A molding process can be performed to form a mold layer having an upper mold portion covering the at least one semiconductor chip and the package substrate and a lower mold portion covering at least a part of a bottom surface of the package substrate and being connected to the upper mold portion. All of the sidewalls of the lower mold portion can be formed to have a symmetrical structure, in a plan view, with respect to the hole.

BRIEF DESCRIPTION OF THE DRAWINGS

The inventive concepts will become more apparent in view of the attached drawings and accompanying detailed description, in which:

FIGS. 2A and 2B are schematic cross-sectional views of the package board taken along lines A-A' and B-B' of FIG. 1, respectively;

FIGS. 7A, 7B, 7D, 7E, and 7F are schematic cross-sectional views of a package board during various stages of manufacture, illustrating a method of forming a semiconductor package having a cross-sectional construction as illustrated in FIG. 2A;

FIGS. 8 to 12 are schematic cross-sectional views of semiconductor packages constructed according to other embodiments of the inventive concepts;

DETAILED DESCRIPTION OF THE EMBODIMENTS

Figure 1:
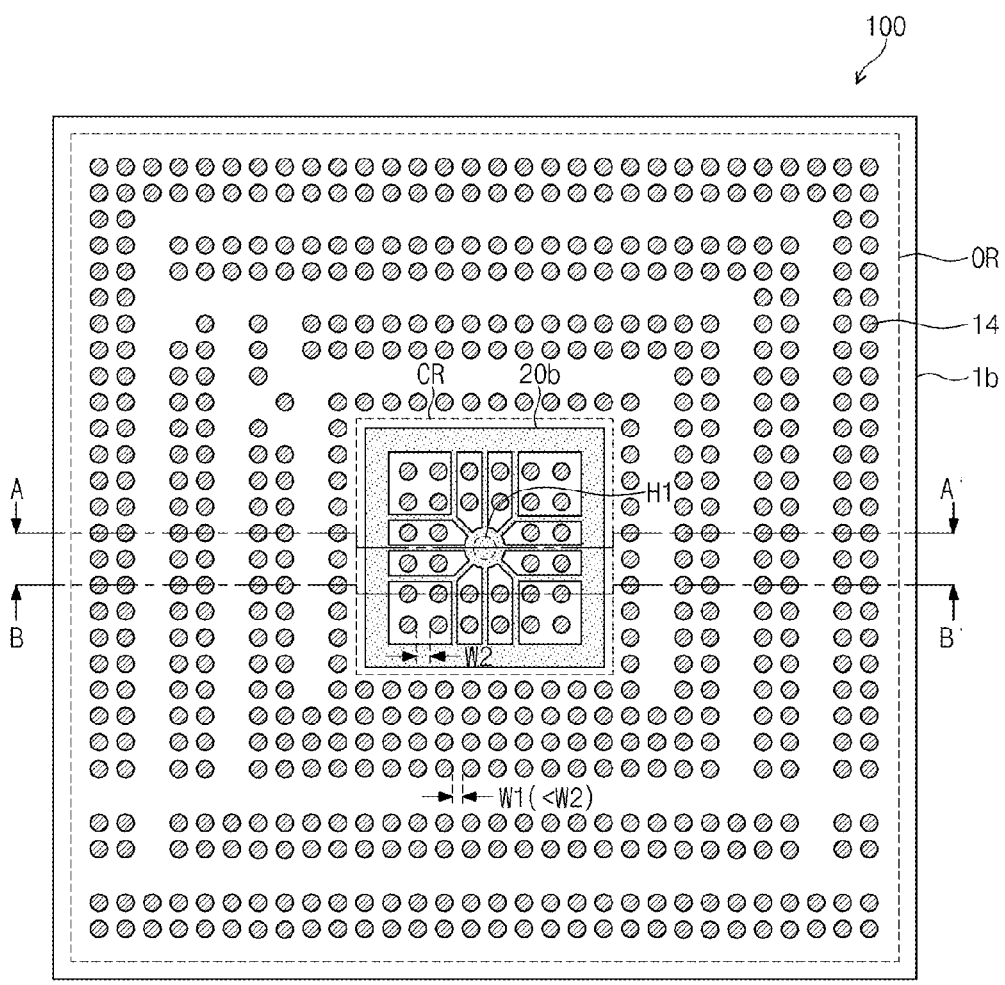
FIG. 1 is a schematic plan view illustrating a bottom surface of a package board according to an embodiment of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and features or components thereof may be exaggerated herein for clarity.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described using various sectional views as idealized exemplary views of the inventive concept. Accordingly, shapes of features and components illustrated in the exemplary views may be modified according to manufacturing techniques and/or allowable errors. Therefore, the embodiments of the inventive concepts are not limited to the specific shapes illustrated in the exemplary views, but may include other shapes that may be created according to desired manufacturing processes. Areas exemplified in the drawings have general properties, and are used to illustrate generalized shapes of elements. Thus, this should not be construed as limiting the scope of the inventive concepts.

More particularly, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the specific shapes of regions illustrated herein, but are to include deviations in shapes that result, for example, from various manufacturing processes. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

It will be also understood that although the terms first, second, third, etc. may be used herein to describe various elements, these elements should not be limited by these terms. These terms are only used to distinguish one element from another element. Thus, a first element in some embodiments could be termed a second element in other embodiments without departing from the teachings of the present inventive concepts. Exemplary embodiments of aspects of the present inventive concepts explained and illustrated herein include their complementary counterparts. The same reference numerals or the same reference designators denote the same or similar elements throughout the specification.

First Embodiment

Figure 2A:
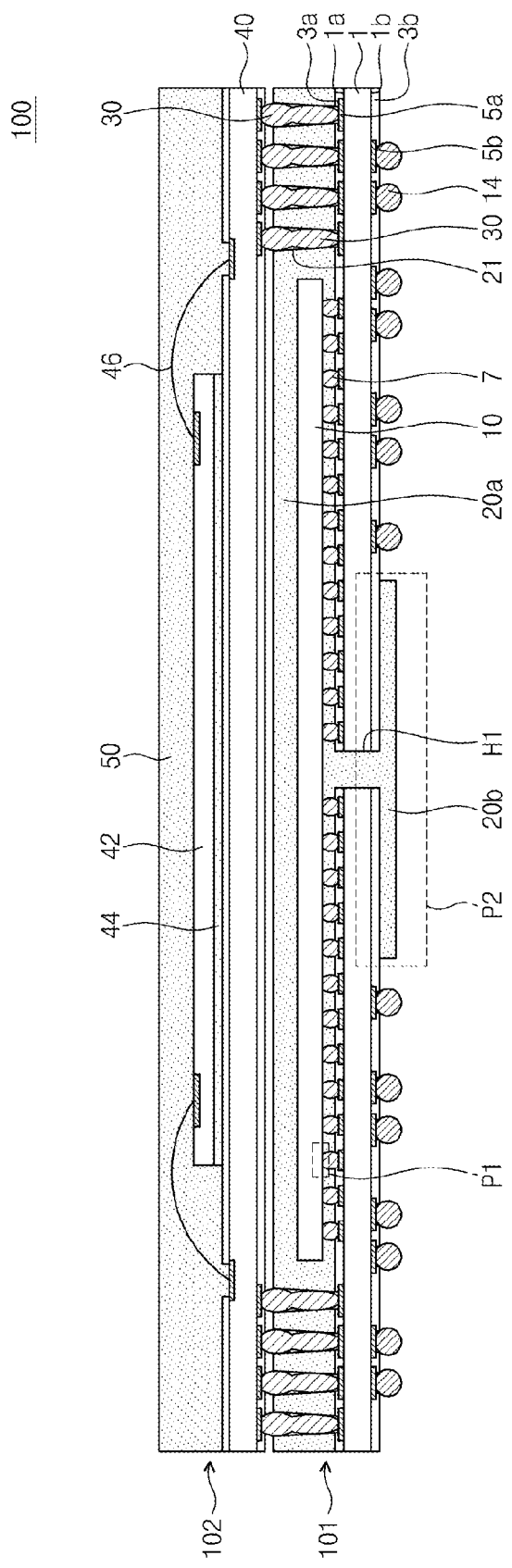

FIG. 1 is a schematic plan view of a bottom surface of a package board 100 constructed according to an embodiment of the inventive concepts. FIGS. 2A and 2B are schematic cross-sectional views of the package board 100 taken along lines A-A' and B-B' of FIG. 1, respectively.

Referring to FIGS. 1, 2A, and 2B, a semiconductor package 100 constructed according to this embodiment may have a package-on-package (PoP) structure including a first semiconductor package 101 and a second semiconductor package 102 mounted on the first semiconductor package 101. The first semiconductor package 101 can include a first package board 1. The first package board 1 may be a single-layered or multi-layered printed circuit board. The first package board 1 may be formed of at least one of bismaleimide triazine resin, alumina-based ceramic, glass-based ceramic, or silicon. The first package board 1 can include a top surface 1a and a bottom surface 1b arranged opposite to each other. Additionally, the first package board 1 can include a hole H1 penetrating through the first package board 1 from the top surface 1a to the bottom surface 1b.

Upper conductive patterns 5a can be disposed on the top surface 1a of the first package board 1. Lower conductive patterns 5b can be disposed on the bottom surface 1b of the first package board 1. The lower conductive pattern 5b may be a ball land. The lower conductive pattern 5b may be formed, for instance, of a conductive material which does not absorb a laser, but instead reflects the laser. For example, the lower conductive pattern 5b may include at least one metal selected from a group consisting of: nickel, lead, gold, and copper. The upper conductive pattern 5a may be formed of the same conductive material as the lower conductive pattern 5b. The top surface 1a and the bottom surface 1b can be covered by an upper insulating layer 3a and a lower insulating layer 3b, respectively. The upper and lower insulating layers 3a and 3b may correspond to solder resist layers and be formed of photoresist layers. The hole H1 may extend to penetrate through the upper and lower insulating layers 3a and 3b.

A first semiconductor chip 10 can be mounted on the top surface 1a of the first package board 1 by a flip chip bonding method. The first semiconductor chip 10 may be connected to the upper conductive pattern 5a through a bump 7. The hole H1 may be overlapped by the first semiconductor chip 10. For example, the hole H1 may be overlapped by a center portion of the first package board 1 and/or a center portion of the first semiconductor chip 10.

Figure 3:
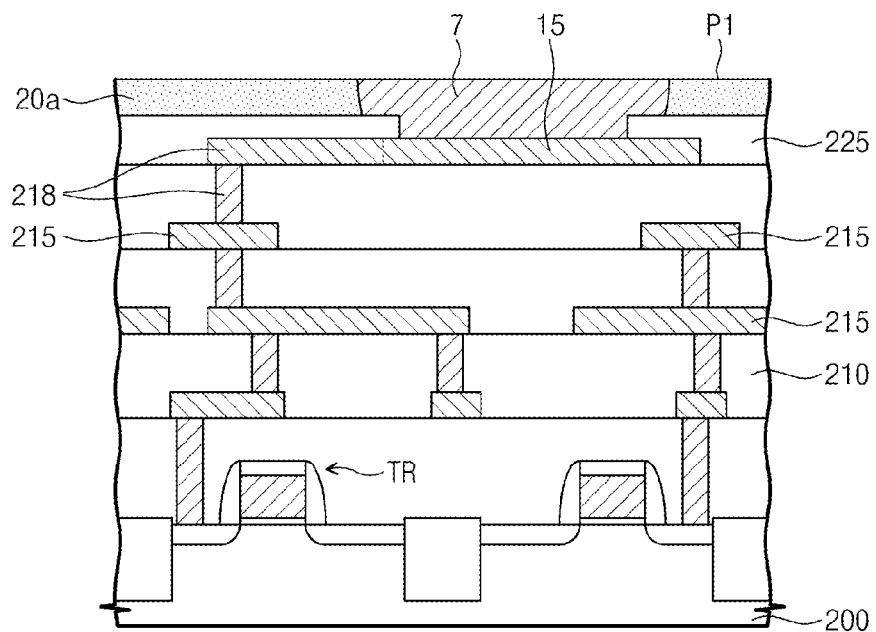
FIG. 3 is an enlarged schematic view of a portion 'P1' of the package board shown in FIG. 2A.

FIG. 3 is an enlarged schematic view of a portion 'P1' of FIG. 2A.

Referring now to FIGS. 2A and 3, a plurality of transistors TR may be disposed on a semiconductor substrate 200, with the transistors TR electrically connected to interconnections 215 within the first semiconductor chip 10. The transistors TR may include non-memory or memory gate electrodes or be connected to data storage elements such as capacitors. The interconnections 215 and the transistors TR can be covered by interlayer insulating layers 210. The uppermost interconnection of the interconnections 215 may be electrically connected to bonding pads 15 through redistribution-interconnections 218. The redistribution-interconnections 218 and portions of the bonding pads 15 can be covered by a passivation layer 225. The bump 7 can be disposed on the bonding pad 15. The bump 7 may, for example, include a metal such as lead, tin, indium, bismuth, antimony, silver, or any alloy thereof.

Referring again to FIGS. 2A and 2B, the first semiconductor package 101 can include a first mold layer 20a and 20b. The first mold layer 20a and 20b can include an upper mold portion 20a and a lower mold portion 20b. The upper mold portion 20a may cover the first semiconductor chip 10 and the top surface 1a of the first package board 1. The lower mold portion 20b may cover a portion of the bottom surface 1b of the first package board 1 and may be connected to the upper mold portion 20a through the hole H1. The upper mold portion 20a may extend to fill a space between the bumps 7 disposed between the first semiconductor chip 10 and the first package board 1.

In the structure according to the present embodiment, the space between first semiconductor chip 10 and the first package board 1 is filled with the upper mold portion 20a without an underfill resin layer, and a void is not formed in a space between the first semiconductor chip 10 and the first package board 1. Thus, because a process of forming the underfill resin layer is not required, a formation process of the semiconductor package 100 may be simplified.

Figure 4A:
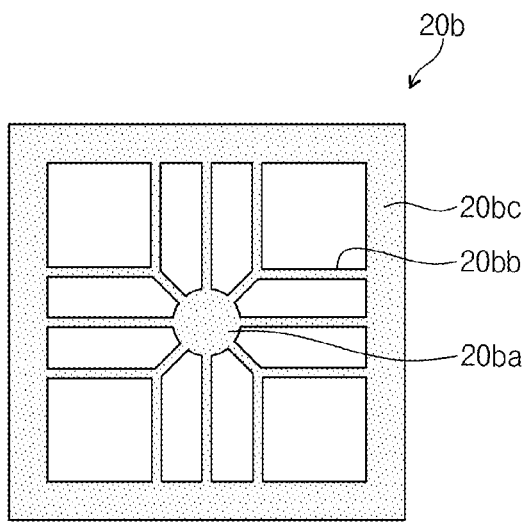
FIG. 4A is a schematic plan view of a lower mold portion of the package board of FIG. 1, illustrating a shape of a lower mold portion.

FIG. 4A is a schematic plan view of a lower mold portion 20b, illustrating a plan shape of a lower mold portion 20b according to one embodiment thereof. FIGS. 4B to 4E are schematic plan views of various lower mold portions 20b, illustrating plan shapes of a lower mold portion 20b according to various alternative embodiments.

Referring to FIGS. 1, 2A, 2B, and 4A to 4E, the first package board 1 can include a center region CR and a peripheral region OR. Lower solder balls 14 can be disposed on the bottom surface 1b in the center region CR and the peripheral region OR. The lower solder balls 14 may penetrate the lower insulating layer 3b to be in contact with the lower conductive patterns 5b. The hole H1 may be disposed at the center of the first package board 1 in the center region CR, and the lower mold portion 20b may be disposed to be overlapped by the hole H1. A height of a bottom surface of the lower mold portion 20b may be lower than a height of (i.e., protrude past) a bottom end of the lower solder ball 14 with respect to the bottom surface 1b of the first package board 1. A first distance W1 represents a distance between adjacent lower solder balls 14 in the peripheral region OR. A second distance W2 represents a distance between adjacent lower solder balls 14 in the center region CR. The first distance W1 may be smaller than the second distance W2. Because the distance between the lower solder balls 14 in the center region CR is greater than the distance between the lower solder balls 14 in the peripheral region OR (e.g., W2>W1), the lower mold portion 20b may be more easily formed.

The sidewalls of the lower mold portion 20b may have a symmetrical structure with respect to the hole H1, when viewed in a plan view. Each of the outermost sidewalls of the lower mold portion 20b may be disposed at a substantially equal distance from a center of the hole H1. Alternatively or additionally, the outermost sidewalls of the lower mold portion 20b may be disposed at a substantially equal distance from corresponding sidewalls of the first package substrate 1.

In an embodiment, the lower mold portion 20b may include a center pattern 20ba overlapped by the hole HE at least one edge pattern 20bc spaced apart from the center pattern 20ba (in plan view), with one or more of the lower solder balls 14 arranged therebetween, and a plurality of connection patterns 20bb disposed between adjacent lower solder balls 14. The plurality of connection patterns 20bb may be connected between the center pattern 20ba and the edge pattern 20bc. The center pattern 20ba may, for instance, have a width equal to or greater than a width of the hole H1.

Figure 4B:
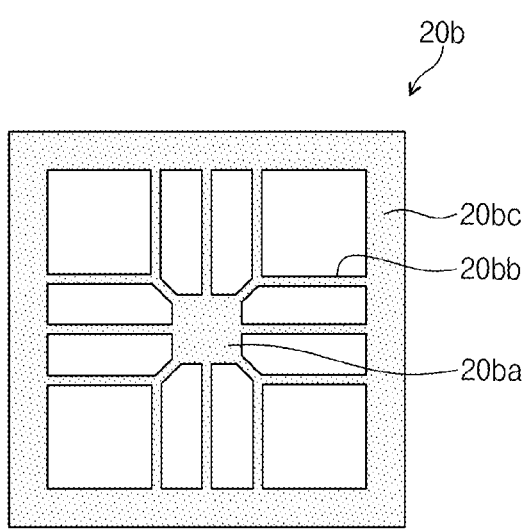
FIGS. 4B to 4E are schematic plan views of a lower mold portion of the package board of FIG. 1 illustrating various modified shapes of the lower mold portion.
Figure 4C:
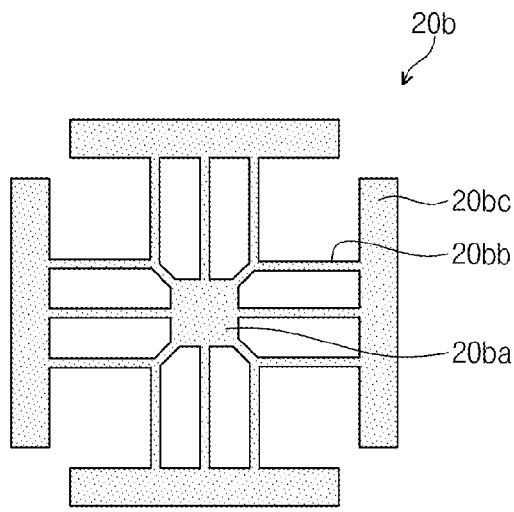
Figure 4D:
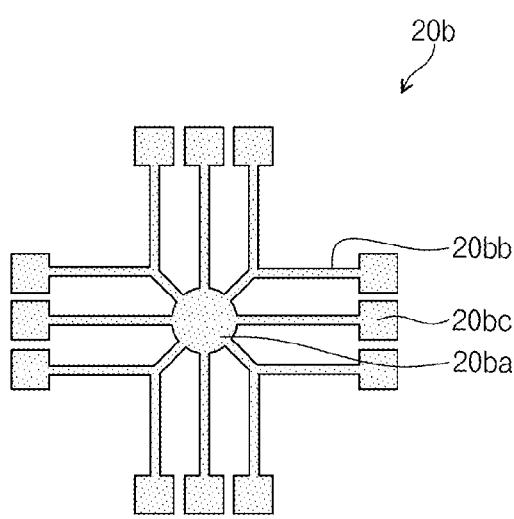
Figure 4E:
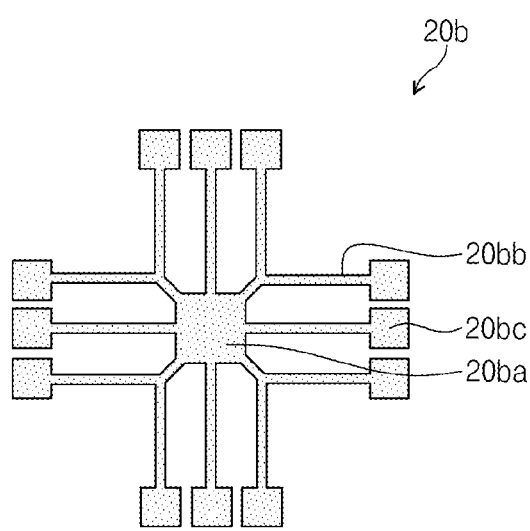

In some embodiments, the center pattern 20ba may have a circular shape in a plan view, as illustrated, for example, in FIG. 4A or 4D. In other embodiments, however, the center pattern 20ba may have a quadrangular shape in a plan view, as illustrated, for example, in FIGS. 4B, 4C, and 4E. In still other embodiments, the center pattern 20ba may have some other polygonal shape in a plan view.

The edge pattern 20bc may have a closed loop-shape in a plan view as illustrated, for example, in FIGS. 4A and 4B. In other embodiments, however, the edge pattern 20bc may have, in a plan view, a bar-shape along each edge portion with spaces separating the edges from each other, as illustrated, for example, in FIG. 4C. In still other embodiments, the edge pattern 20bc may have a small quadrangular shape at the end of each connection pattern 20bb, or a discontinuous shape along each edge, in a plan view as illustrated, for example, in FIG. 4D or 4E.

It should be noted, however, that the shape of the edge pattern 20bc is not limited to any of these specific embodiments. In other embodiments, for example, the edge pattern 20bc may have a circular, polygonal, or other shape in a plan view. The connection pattern 20bb may have a narrower width than the center pattern 20ba and the edge pattern 20bc.

According to aspects of the inventive concepts, a stress applied to the semiconductor package 100 may be uniformly relieved in all sidewall directions in a plan view due to the shape of the lower mold portion 20b, so that a warpage phenomenon of the semiconductor package 100 may be improved. Additionally, a resin solution for the lower mold portion may uniformly flow in each of the sidewall directions during a process of forming the lower mold portion 20b, so that the lower mold portion 20b may be stably formed without a void or a shape modification.

The upper and lower mold portions 20a and 20b of the first mold layer are distinguished from each other in the description and drawings for the purpose of ease and convenience in explanation. However, the upper and lower mold portions 20a and 20b may be connected together without an interface therebetween so as to constitute a single, integrated body. Additionally, the upper and lower mold portions 20a and 20b may be formed of the same material. The first mold layer (including the upper and lower mold portions 20a and 20b) may include a resin layer having a plurality of filler particles dispersed in the resin layer. The resin layer may include at least one polymer material. The filler particles may include a material such as silica or alumina.

FIGS. 5A to 5H are enlarged schematic views of a portion 'P2' of the semiconductor package 100 of FIG. 2A, illustrating various alternative embodiments of the inventive concepts.

As illustrated in FIGS. 5A to 5D, a bottom surface of the lower mold portion 20b may be substantially flat. Alternatively, a portion of the bottom surface of the lower mold portion 20b may protrude or be recessed as compared to the rest of the bottom surface, as illustrated in FIGS. 5E to 5H. For example, a center pattern 20ba of the lower mold portion 20b may protrude away from a bottom surface of the lower insulating layer 3b more than at least one of the edge pattern 20bc and the connection pattern 20bb.

Figure 5A:
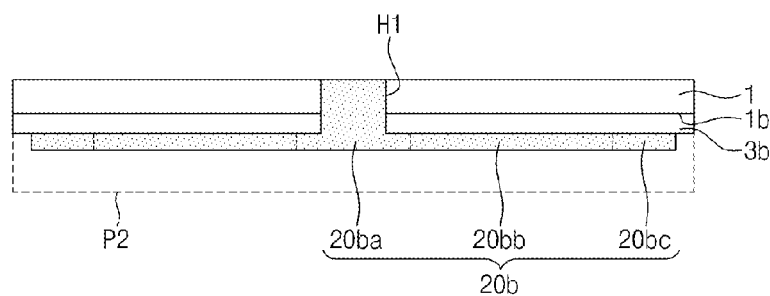
FIGS. 5A to 5H are enlarged schematic cross-sectional views of a portion 'P2' of the package board shown in FIG. 2A according to various alternative embodiments of the inventive concepts.
Figure 5B:
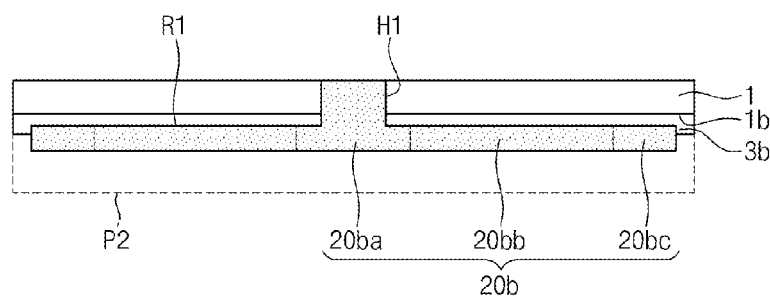
Figure 5C:
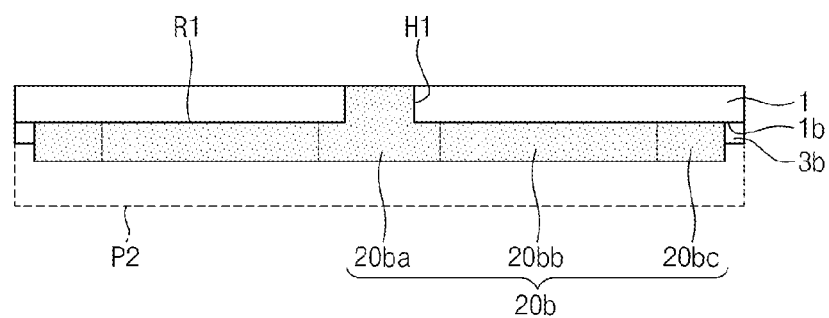
Figure 5D:
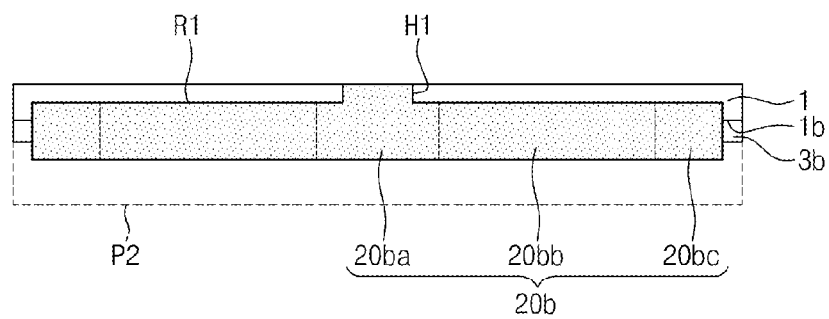
Figure 5E:
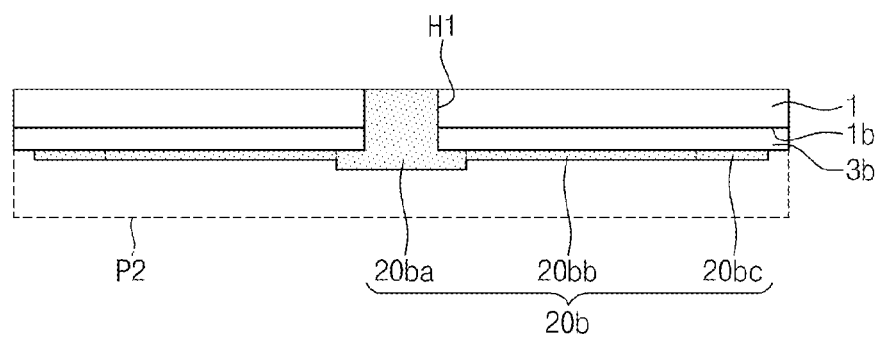
Figure 5F:
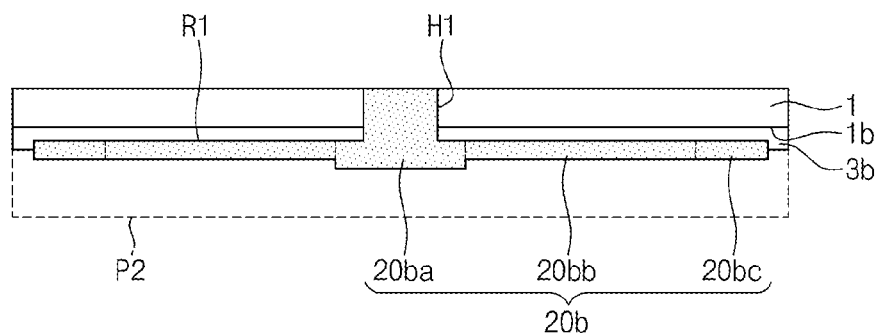
Figure 5G:
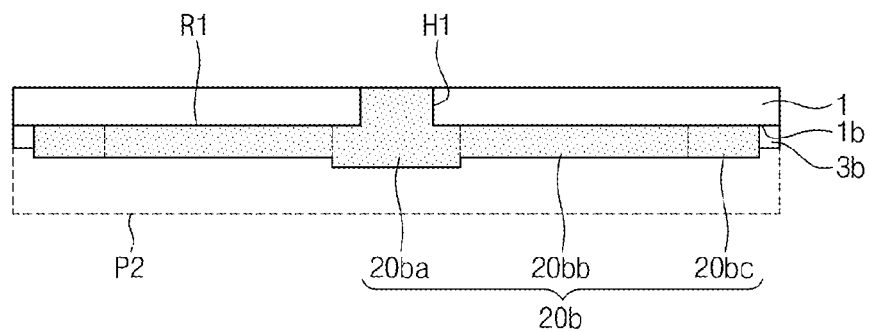
Figure 5H:
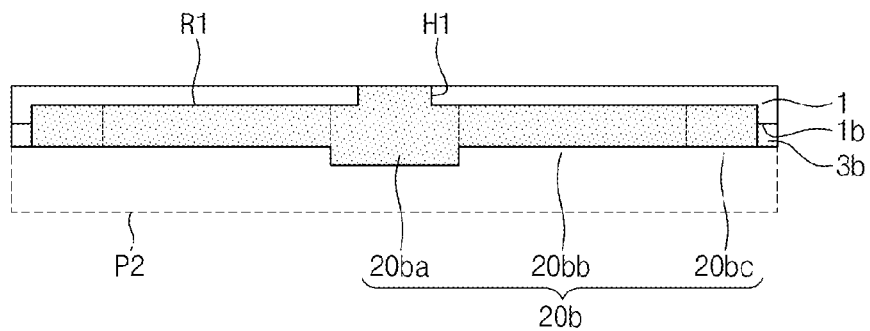

In some embodiments, the lower mold portion 20b may have an upper surface that contacts and coincides with a bottom surface of the lower insulating layer 3b, except where it extends through the hole H1, as illustrated for example in FIGS. 5A and 5E. In various alternative embodiments, however, a first recessed region R1 may be formed in the lower insulating layer 3b, as illustrated for example in FIGS. 5B, 5C, 5F, and 5G. A depth of the first recessed region R1 may be smaller than a thickness of the lower insulating layer 3b, as illustrated for example in FIGS. 5B and 5F. Alternatively, the depth of the first recessed region R1 may be substantially equal to the thickness of the lower insulating layer 3b, as illustrated for example in FIGS. 5C and 5G. In still another embodiment, the first recessed region R1 may be formed in the lower insulating layer 3b and a portion of the first package board 1, as illustrated for example in FIGS. 5D and 5H. The lower mold portion 20b may be disposed in the first recessed region R1 as illustrated in FIGS. 5B to 5D and 5F to 5H.

Figure 6A:
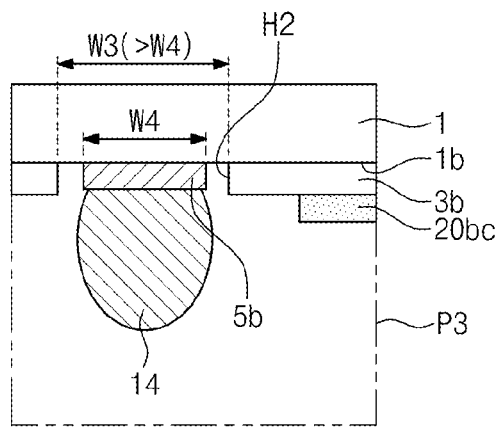
FIGS. 6A and 6B are schematic cross-sectional views of portions 'P3' and 'P4', respectively, of the package board shown in FIG. 2B.
Figure 6B:
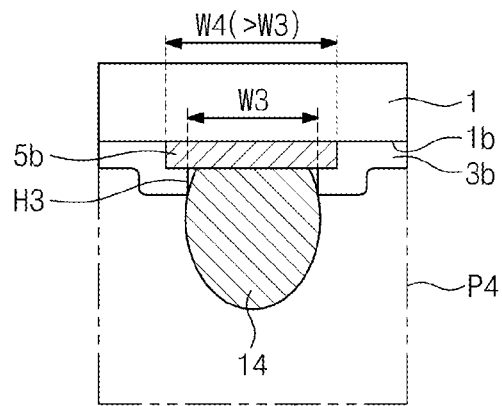

FIGS. 6A and 6B are schematic cross-sectional views of portions 'P3' and 'P4' of the semiconductor package 100 of FIG. 2B, respectively.

Referring to FIGS. 1, 2B, 6A, and 6B, a first lower hole H2 and a second lower hole H3 may be formed in the lower mold portion 3b. The first lower hole H2 may be formed to expose the lower conductive pattern 5b adjacent to the lower mold portion 20b in the center region CR. The second lower hole H3 may be formed to expose the lower conductive pattern 5b in the peripheral region OR. As illustrated in FIG. 6A, a width W3 of the first lower hole H2 may be greater than a width W4 of the lower conductive pattern 5b in the center region CR. In this case, a sidewall of the lower conductive pattern 5b may be spaced apart from an inner sidewall of the first lower hole H2 in the center region CR and an entire lower conductive pattern 5b may not be covered by the lower insulating layer 3b in the center region CR.

The bottom surface of the lower insulating layer 3b may therefore be substantially flat in the center region CR in which the lower mold portion 20b is formed. As a result, a mold used in forming the lower mold portion 20b may come in close contact with the flat bottom surface of the lower insulating layer 3b during the manufacturing process, and a vacuum state may be generated very well. Thus, the lower mold portion 20b may be smoothly formed in the center region.

On the other hand, as illustrated in FIG. 6B, a width W3 of the second lower hole H3 may be smaller than a width W4 of the lower conductive pattern 5b in the peripheral region OR. Thus, the lower insulating layer 3b being bent around the conductive pattern 5b. Referring to FIGS. 2A and 2B, the second semiconductor package 102 may include a second package board 40, a second semiconductor chip 42 mounted on the second package board 40, and a second mold layer 50 covering the second semiconductor chip 42. The semiconductor chip 42 may be adhered to the second package board 40 with an adhesive layer 44 therebetween. The adhesive layer 44 may, for instance, be a double-sided tape or an adhesive. The second semiconductor chip 42 may be electrically connected to the second package board 40 by wires 46.

An upper hole 21 may be formed in the upper mold portion 20a. The upper hole 21 can be formed to expose the upper conductive pattern 5a. A connection solder 30 may then be disposed in the upper hole 21. The connection solder 30 electrically connects the upper conductive pattern 5a to the second package board 40.

FIGS. 7A, 7B, 7D, 7E, and 7F are schematic cross-sectional views of a semiconductor package 100 during various stages of manufacture, illustrating a method of forming a semiconductor package 100 having a cross-sectional view as illustrated in FIG. 2A. FIG. 7C is a schematic plan view illustrating a layout of a portion of a lower mold frame.

Referring first to FIG. 7A, to manufacture the semiconductor package 101 of FIG. 8, a first package board 1 is prepared. The first package board 1 includes a top surface 1a and a bottom surface 1b arranged opposite each other, upper conductive patterns 5a disposed on the top surface 1a, lower conductive patterns 5b disposed on the bottom surface 1b, and a hole H1 connecting the top surface 1a to the bottom surface 1b. An upper insulating layer 3a covers the top surface 1a, and a lower insulating layer 3b covers the bottom surface 1b.

A first semiconductor chip 10 is arranged on the first package board 1. The first semiconductor chip 10 may include bumps 7. The bumps 7 may be heated at a temperature equal to or greater than a melting point thereof, such that the bumps 7 are melt-bonded to the upper conductive patterns 5a. Thus, the first semiconductor chip 10 may be mounted on the top surface 1a of the package board 1 by a flip chip bonding method. First solder balls 12 may be melt-bonded to the upper conductive patterns 5a which are not overlapped by the first semiconductor chip 10.

Figure 7C:
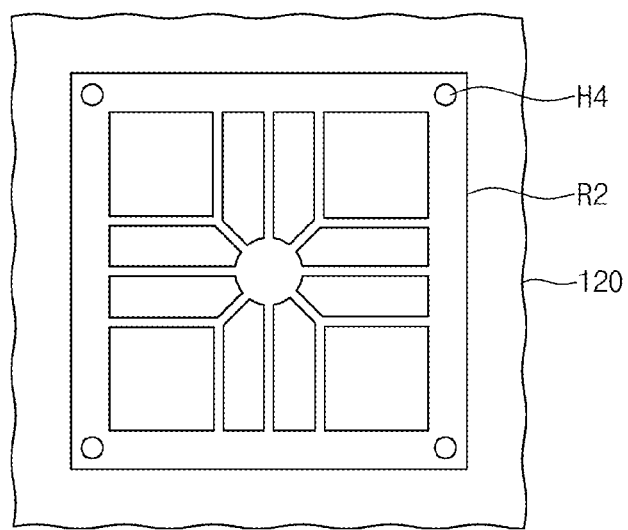
FIG. 7C is a schematic plan view of a layout of a portion of a lower mold.

Referring now to FIGS. 7B, 7C, and 7D, a molding process may be performed to form a first mold layer including upper and lower mold portions 20a and 20b. More specifically, the first package board 1 including the mounted first semiconductor chip 10 may be located between a lower mold 120 and an upper mold 122. A second recessed region R2 can be formed on the lower mold 120. The second recessed region R2 is overlapped by the hole H1 and defines one of the shapes of the lower mold portion 20b described previously with reference to FIGS. 4A to 4E and 5A to 5H.

For example, FIG. 7C illustrates a second recessed region R2 which has a shape corresponding to the shape of the lower mold portion 20b of FIG. 4A. However, the inventive concepts are not limited thereto. As described above, the second recessed region R2 may have a shape corresponding to any one of the shapes of the lower mold layer 20b described with reference to FIGS. 4B to 4E, or any other desired shape.

Additionally, a bottom surface of the second recessed region R2 may be flat to correspond to the bottom surface of the lower mold portion 20b described with reference to FIGS. 5A to 5D and FIG. 7B. However, the inventive concepts are not limited thereto. In other embodiments, for example, the bottom surface of the second recessed region R2 may have a bent shape that corresponds, for instance, to any one of the bottom surfaces of the lower mold portion 20b described with reference to FIGS. 5E to 5H.

A vent hole H4 may be formed to penetrate through the lower mold 120 in a portion of the second recessed region R2 that may overlap with the edge pattern 20bc of the lower mold portion 20b. The position of the vent hole H4 may be varied as desired. Additionally, one or more additional holes may be formed in the upper mold 122 for exhausting air. A concave region defining the shape of the upper mold portion 20a may be formed in the upper mold 122. Additionally, one or more resin solution supplying holes (not shown) may be formed along a side of the upper mold 122 for supplying a resin solution for forming a mold portion.

When the resin solution for forming the mold portion is supplied through the resin solution supplying hole, air between the upper and lower molds 122 and 120 can be exhausted through the vent hole H4. At this time, the hole H1 may also function as an air vent to help maintain a steady flow of the resin solution in a forward direction. Thus, it may therefore be possible to prevent formation of a void.

If the hole H1 does not exist, a void may be formed between bumps as a result of a difference between flowing speeds of the resin solution for forming the mold portion. In that case, when a reflow process is performed for mounting the semiconductor package on a mother board, the bumps may be melted to come in contact with each other in the void and a short between the bumps may occur. Additionally, moisture in the void may expand in a high temperature process, such that the void may burst.

However, because the first package board 1 according to the inventive concepts may include the hole H1, the resin solution may flow freely and fully fill the concave region of the upper mold 122, the second recessed region R2 of the lower mold 120, and the space between the first semiconductor chip 10 and the first package board 1 without the formation of a void. Additionally, each of the inner sidewalls of the second recessed region R2 may have a symmetrical structure with respect to the hole H1 in a plan view, such that the flowing speeds of the resin solution may be substantially equal to each other in all sidewall directions. Thus, it is possible to prevent a void from forming in the lower mold portion 20b formed in a subsequent process or during shape modification of the lower mold portion 20b.

Next, a hardening process may be performed to convert the resin solution into a first mold layer (including the upper and lower mold portions 20a and 20b), and then the molds 122 and 120 may be removed. Thus, the upper mold portion 20a and the lower mold portion 20b can be formed simultaneously. The upper mold portion 20a covers the first semiconductor chip 10 and the top surface 1a of the first package board 1 and fills the space between the first semiconductor chip 10 and the package board 1. The lower mold portion 20b covers a portion of the bottom surface 1b of the first package board 1.

Referring now to FIG. 7E, portions of the upper mold portion 20a may be removed to form upper holes 21 exposing the first solder balls 12 disposed at both sides of the first semiconductor chip 10, respectively. The process of removing portions of the upper mold portion 20a may be performed, for instance, by a laser drilling process. Subsequently, a singulation process may be performed to cut the upper mold portion 20a and the first package board 1. Thus, a plurality of unit semiconductor packages may be separated from each other. The singulation process may be performed, for example, using a diamond cutter. Lower solder balls 14 may then be bonded to (or melt-bonded to) the lower conductive patterns 5b. In other embodiments, the bonding process of the lower solder balls 14 may be performed before the singulation process. As a result of this manufacturing process, the first semiconductor package 101 may be realized.

Figure 7F:
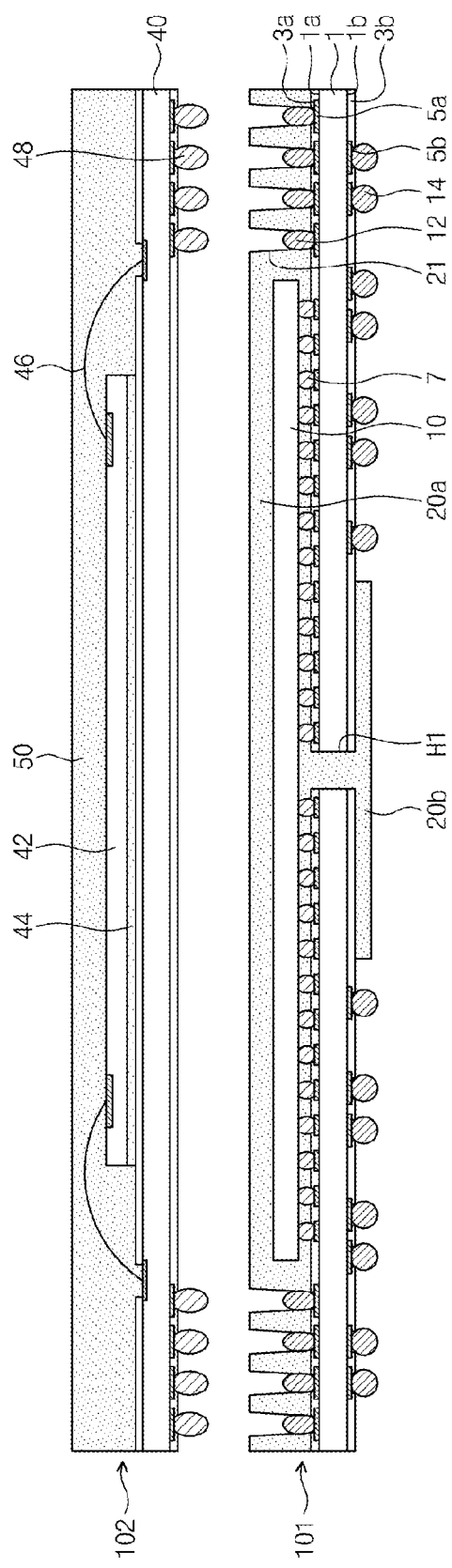

Referring now to FIG. 7F, the second semiconductor package 102 described above can be manufactured and attached to the first semiconductor package 101. Second solder balls 48 may be melt-bonded to a bottom surface of the second package board 40. The second semiconductor package 102 may then be located on the first semiconductor package 101, with the second solder balls 48 inserted in the upper holes 21 so as to come in contact with corresponding ones of the first solder balls 12. The first and second solder balls 12 and 48 may then be heated to a temperature equal to or greater than a melting point thereof. Thus, the first and second solder balls 12 and 48 may be melt-bonded to each other to form the connection solder 30 as illustrated in FIG. 2A, such that the first and second semiconductor packages 101 and 102 are electrically connected to each other. As a result, the semiconductor package 100 having the package-on-package (PoP) structure as illustrated in FIG. 2A may be realized.

FIGS. 8 to 12 are schematic cross-sectional views of semiconductor packages constructed according to other embodiments of the inventive concepts.

Second Embodiment

Referring to FIG. 8, rather than forming the package-on-package structure as described above, the first semiconductor package 101 can be independently manufactured and provided. In this case, the first semiconductor package 101a may not include the upper hole 21 and the connection solder ball 30. Other elements of the first semiconductor package 101a, however, may be the same as or similar to the corresponding elements of the previously described embodiment of the first semiconductor package 101.

Third Embodiment

Referring to FIG. 9, a semiconductor package 104 according to an alternative embodiment may have a package-on-package (PoP) structure including the second semiconductor package 102 mounted on a third semiconductor package 103. The third semiconductor package 103 may be similar to the first semiconductor package 101 described in the first embodiment. Unlike the earlier embodiment, however, two first semiconductor chips 10a and 10b may be horizontally mounted on the first package board 1 in the third semiconductor package 103 using the flip chip bonding method. In this embodiment, a plurality of holes H1 may be formed in the first package board 1. The holes H1 may be overlapped by the first semiconductor chips 10a and 10b, respectively. A lower mold portion 20b may be connected to an upper mold portion 20a through the plurality of holes H1, and may also cover the bottom surface of the package board 1. A plan shape and a cross-section shape of the lower mold portion 20b in each of the chip regions according to the present embodiment may be the same as or similar to the lower mold portion 20b described in the first embodiment. Other elements of the first semiconductor package 104 according to the present embodiment may be the same as or similar to the corresponding elements of the first embodiment.

Fourth Embodiment

Figure 10:
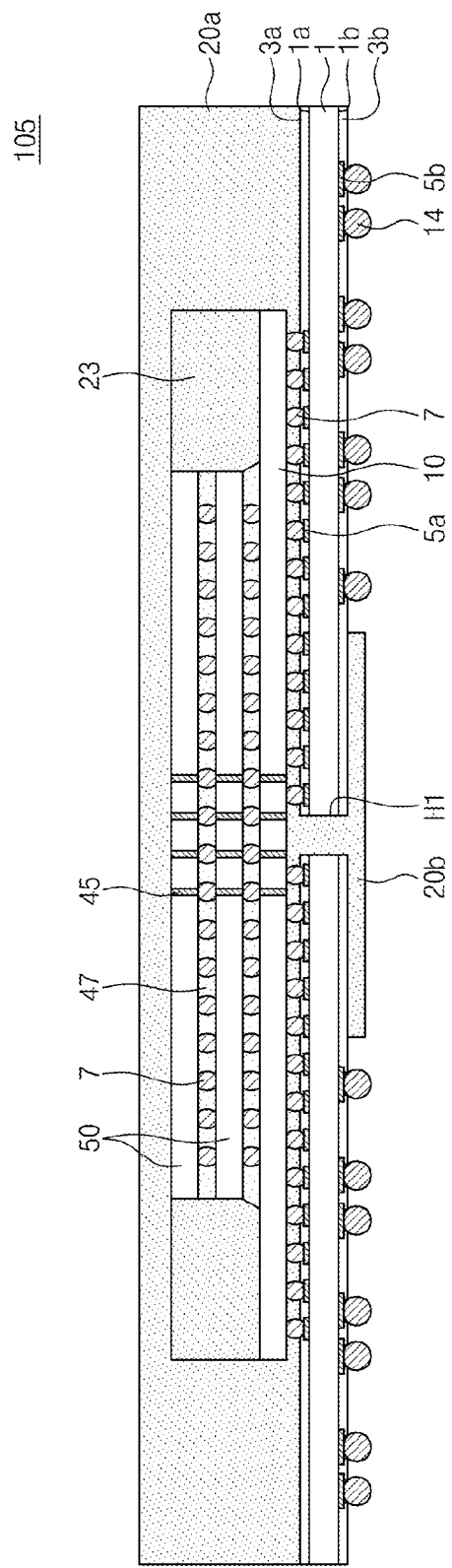

Referring to FIG. 10, a semiconductor package 105 according to yet another embodiment may be similar to the first semiconductor package 101a of the second embodiment illustrated in FIG. 8. In this embodiment, however, the semiconductor package 105 may further include a plurality of second semiconductor chips 50 stacked on the first semiconductor chip 10 using a flip chip bonding method. A width of the first semiconductor chip 10 may be greater than widths of the second semiconductor chips 50. Each of the first and second semiconductor chips 10 and 50 may include through-vias 45 penetrating through an inside thereof. The first semiconductor chip 10 and the second semiconductor chip 20 may be electrically connected to each other. An underfill resin layer 47 may be disposed between the first semiconductor chip 10 and the second semiconductor chip 50 and/or between the second semiconductor chips 50. An inner mold portion 23 may cover sidewalls of the second semiconductor chips 50, a sidewall of the underfill resin layer 47, and a top surface of the first semiconductor chip 10. An upper mold portion 20a may cover a top surface of the semiconductor chip 50, the inner mold portion 23, and the top surface of the first package board 1. Other elements of the semiconductor package 105 according to the present embodiment may be the same as or similar to corresponding elements of the second embodiment.

Fifth Embodiment

Figure 11:
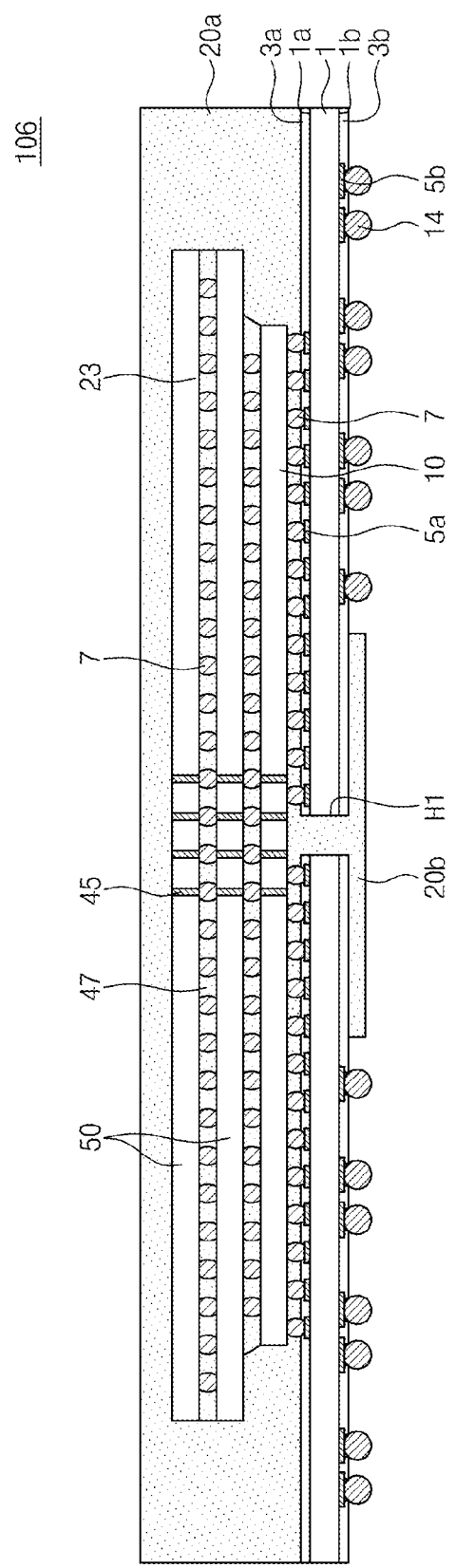

Referring to FIG. 11, a semiconductor package 106 according to a still further embodiment may be similar to the semiconductor package 105 of the fourth embodiment. Unlike the fourth embodiment 105, however, the width of the first semiconductor chip 10 may be smaller than widths of second semiconductor chips 50. Additionally, the semiconductor package 106 may not include the inner mold portion 23 of the fourth embodiment. Other elements of the semiconductor package 106 according to the present embodiment may be the same as or similar to corresponding elements of the second embodiment.

Sixth Embodiment

Figure 12:
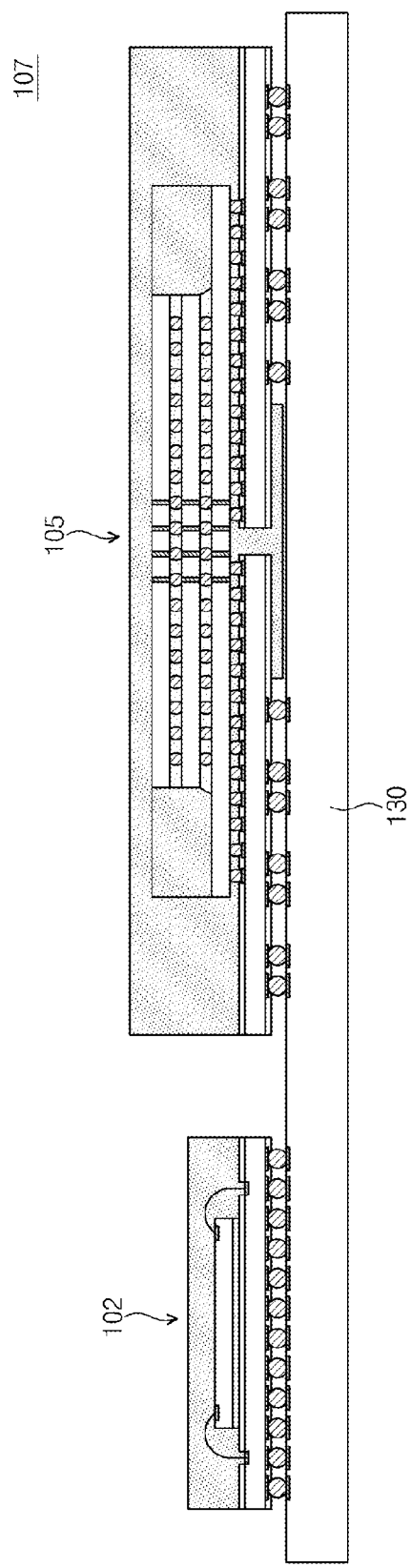

Referring to FIG. 12, a semiconductor package 107 according to yet another embodiment may include the second semiconductor package 102 of the first embodiment and the semiconductor package 105 of the fourth embodiment mounted horizontally adjacent each other on a third package board 130. The third package board 130 may, for instance, be a module board. Other elements of the semiconductor package 107 according to the present embodiment may be the same as or similar to the corresponding elements of the first and fourth embodiments.

It should be understood that the various semiconductor package manufacturing techniques and resulting devices described herein may be applied to numerous various kinds of semiconductor devices and package modules including the same.

Figure 13:
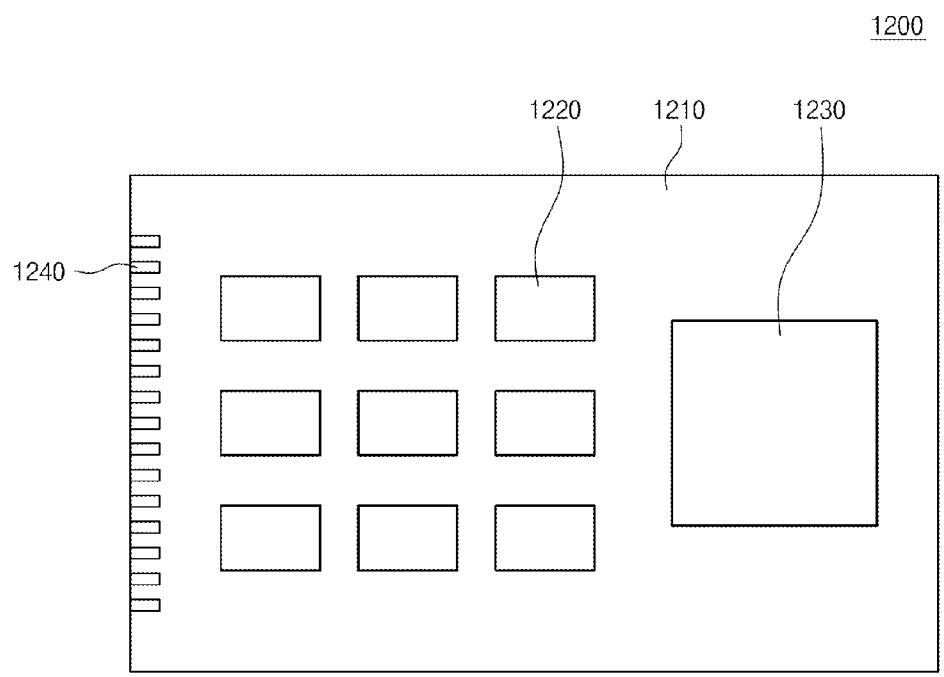
FIG. 13 is a schematic block diagram illustrating an example of package modules including semiconductor packages constructed according to embodiments of the inventive concepts.

FIG. 13, for instance, is a schematic block diagram illustrating an example of a package module including semiconductor packages constructed according to embodiments of the inventive concepts. Referring to FIG. 13, a package module 1200 may include a semiconductor integrated circuit device 1220 and a semiconductor integrated circuit device 1230 encapsulated by a quad flat package (QFP) technique. The semiconductor devices 1220 and 1230 constructed according to the semiconductor package techniques of the inventive concepts can be installed on a substrate 1210 to form the package module 1200. The package module 1200 may be connected to an external electronic device through external connecting terminals 1240 disposed at a side of the substrate 1210.

Figure 14:
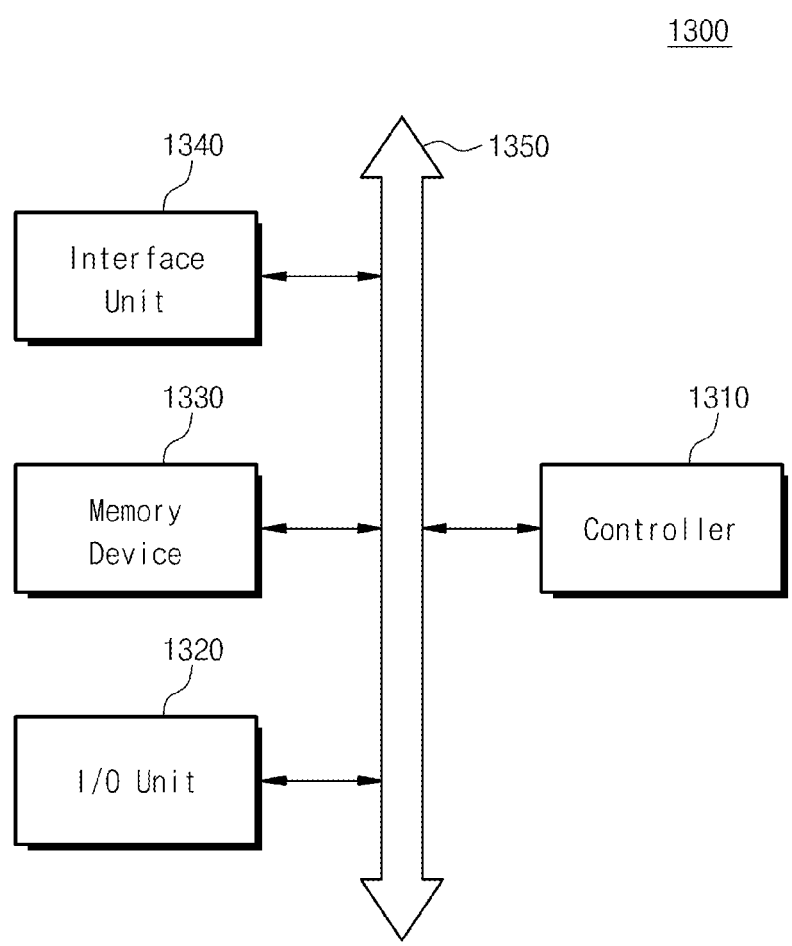
FIG. 14 is a schematic block diagram illustrating an example of an electronic device including one or more semiconductor packages constructed according to embodiments of the inventive concepts.

The semiconductor package techniques described above may also be applied to electronic systems. FIG. 14 is a schematic block diagram illustrating an example of an electronic device including semiconductor packages constructed according to embodiments of the inventive concepts. Referring to FIG. 14, an electronic system 1300 may include a controller 1310, an input/output (I/O) unit 1320, and a memory device 1330. The controller 1310, the I/O unit 1320, and the memory device 1330 may communicate with each other through a data bus 1350. The data bus 1350 may correspond to a path through which electrical signals are transmitted. For example, the controller 1310 may include at least one of a microprocessor, a digital signal processor, a microcontroller or other logic devices. The other logic devices may have a similar function to any one of the microprocessor, the digital signal processor, and the microcontroller.

The controller 1310 and/or the memory device 1330 may include at least one of the semiconductor packages constructed according to any one or more of the aforementioned embodiments of the inventive concepts. The I/O unit 1320 may include a keypad, a keyboard and/or a display unit. The memory device 1330 stores logic data. The memory device 1330 may store data and/or commands performed by the controller 1310. The memory device 1330 may include a volatile memory device and/or a non-volatile memory device. Alternatively, the memory device 1330 may be formed of a flash memory device.

The semiconductor packages constructed according to the inventive concepts herein may, for example, be applied to information processing systems such as a mobile device and/or a desk top computer. The memory device 1330 may consist of a solid state disk (SSD). In this case, the electronic system 1300 may stably store massive data in the memory device 1330. The electronic system 1300 may include an interface unit 1340 which may transmit electrical data to a communication network or may receive electrical data from a communication network. The interface unit 1340 may include an antenna or a wireless or cable transceiver. Even though not shown in the drawings, an application chipset and/or a camera image processor (CIS), and an input/output unit may further be provided in the electronic system 1300.

The electronic system 1300 may be realized as a mobile system, a personal computer, an industrial computer, or a logic system performing various functions. For example, the mobile system may be one or more of a personal digital assistant (PDA), a portable computer, a web tablet, a wireless phone, a mobile phone, a laptop computer, a digital music player, a memory card, and an information transmitting/receiving system. If the electronic system 1300 performs a wireless communication, the electronic system 1330 may be used in communication interface protocol such as CDMA, GSM, NADC, E-TDMA, WCDAM, and/or CDMA2000.

Figure 15:
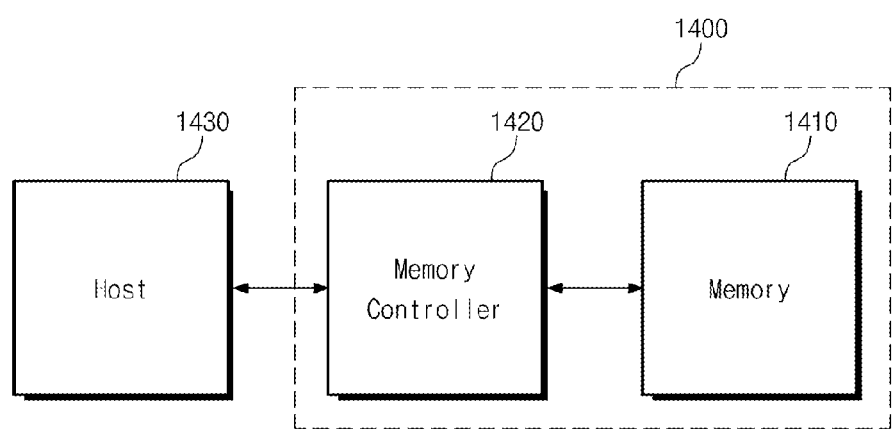
FIG. 15 is a schematic block diagram illustrating an example of a memory system including one or more semiconductor packages constructed according to embodiments of the inventive concepts.

The semiconductor packages constructed with the techniques of the inventive concepts may also be applied to memory cards. FIG. 15 is a schematic block diagram illustrating an example of a memory system including semiconductor packages constructed according to embodiments of the inventive concepts. Referring to FIG. 15, a memory card 1400 may include a non-volatile memory device 1410 and a memory controller 1420. The non-volatile memory device 1410 and the memory controller 1420 may store data and/or read stored data. The non-volatile memory device 1410 may include at least one of non-volatile memory devices constructed according to the semiconductor package techniques described with respect to the aforementioned embodiments. The memory controller 1420 may read the stored data or store data in the non-volatile memory device 1410 in response to read/write request of a host 1430.

In summary, in a semiconductor package according to embodiments of the inventive concepts, all sidewalls of the lower mold portion may have a symmetrical structure and arrangement with respect to a hole penetrating the package board, such that a risk of a warpage phenomenon of the semiconductor package may be reduced. Additionally, the lower mold portion may be more stably formed to prevent the formation of a void.

Also in the semiconductor package, the lower hole formed in the lower insulating layer adjacent to the lower mold portion may have a width wider than the lower conductive pattern, such that the lower insulating layer does not cover the lower conductive pattern. In such an embodiment, the lower insulating layer may have a substantially flat bottom surface. As a result, a vacuum state may be generated very well during the formation of the lower mold portion in a region where the lower mold portion is formed. The lower mold portion may therefore be more stably formed.

Since, according to principles of the inventive concepts, a void is not formed by the lower mold portion, the reliability of the semiconductor package may be improved. Additionally, since the underfill region layer need not be formed between the semiconductor chip and the package board, a dam for preventing the flow of an underfill resin solution is not required. Thus, a vertical and/or horizontal size of the semiconductor package may be reduced.

In the semiconductor package according to other embodiments, portions of the lower mold portion can be disposed between the lower solder balls disposed on the bottom surface of the package board, such that a short between the lower solder balls may be prevented.

In the method of forming a semiconductor package according to still other embodiments, a package board including a hole may be used. The hole may function as an air vent to help maintain a steady forward flow of resin solution for forming the mold portion during the mold formation process. Thus, the space between the semiconductor chip and the package board may be filled with the upper mold portion without the formation of a void. As a result, a short between bumps may be substantially prevented and problems caused by moisture may also be substantially solved. Thus, the reliability of the semiconductor package may be improved and a production yield of semiconductor packages formed according to these principles may increase. Additionally, the underfill resin layer may be not required and the formation process of the semiconductor package may therefore be simplified.

While the inventive concepts have been described with reference to various example embodiments, it will be apparent to those skilled in the art that numerous changes and modifications may be made without departing from the spirit and scope of the inventive concepts. Therefore, it should be understood that the above embodiments are not limiting, but merely illustrative. Thus, the scope of the inventive concepts is to be determined by the broadest permissible interpretation of the following claims and their equivalents, and shall not be restricted or limited by the foregoing description.

What is claimed is:

1. A semiconductor package comprising:
   a package board including at least one hole;
   at least one semiconductor chip mounted on the package board by a flip chip bonding method;
   a mold layer having an upper mold portion covering the at least one semiconductor chip and the package board and a lower mold portion connected to the upper mold portion through the hole, the lower mold portion covering at least a portion of a bottom surface of the package board;
   lower solder balls disposed on the bottom surface of the package board, wherein the lower solder balls are not covered by the lower mold portion, and
   wherein a plurality of outermost sidewalls of the lower mold portion are disposed at a substantially equal distance from a center of the hole; and
   wherein the lower mold portion comprises:
      a center pattern overlapped by the hole;
      at least one edge pattern spaced apart from the center pattern with at least one of the lower solder balls disposed therebetween; and
      a plurality of connection patterns connecting the center pattern to the edge pattern, wherein each of said connection patterns is disposed between adjacent ones of the lower solder balls.

2. The semiconductor package of claim 1, wherein the center pattern has a circular or polygonal shape having a width equal to or greater than a width of the hole.

3. The semiconductor package of claim 1, wherein the edge pattern has a closed-loop shape, a circular shape, or a polygonal shape.

4. The semiconductor package of claim 1, wherein the connection pattern has a width narrower than a width of either the center pattern or the edge pattern.

5. The semiconductor package of claim 1, further comprising:
   a first lower conductive pattern and a second lower conductive pattern disposed on the bottom surface of the package board, the first lower conductive pattern bonded to lower solder balls located adjacent to the lower mold portion, and the second lower conductive pattern bonded to lower solder balls located adjacent to a sidewall of the package board; and
   a lower insulating layer covering the bottom surface of the package board, the lower insulating layer including a first lower hole exposing the first lower conductive pattern and a second lower hole exposing the second lower conductive pattern.

6. The semiconductor package of claim 5, wherein a width of the first lower conductive pattern is smaller than a width of the first lower hole.

7. The semiconductor package of claim 5, wherein a width of the second lower conductive pattern is greater than a width of the second lower hole.

8. The semiconductor package of claim 5, wherein the lower insulating layer includes a recessed region; and
   wherein at least a portion of the lower mold portion is disposed in the recessed region.

9. The semiconductor package of claim 5, wherein the lower mold portion penetrates through the lower insulating layer so as to be in contact with the bottom surface of the package board.

10. The semiconductor package of claim 5, wherein the lower mold portion is at least partially disposed in a recessed region formed in the lower insulating layer and a portion of the package board.

11. The semiconductor package of claim 1, wherein the center pattern protrudes away from the semiconductor package more than at least one of the edge patterns and the connection patterns.

12. The semiconductor package of claim 1, wherein the lower solder balls include first lower solder balls arranged adjacent to the lower mold portion and second lower solder balls arranged adjacent to a sidewall of the package board; and
   wherein a distance between adjacent ones of the first lower solder balls is greater than a distance between adjacent ones of the second lower solder balls.

13. The semiconductor package of claim 1, wherein the upper mold portion fills a space between the semiconductor chip and the package board; and
   wherein the upper mold portion and lower mold portion are connected to each other without an interface therebetween to constitute a single, integrated body.

14. A semiconductor package comprising:
   a package board comprising at least one hole formed therethrough;
   at least one semiconductor chip flip chip mounted on the package board so as to overlap the at least one hole; and
   a mold layer having an upper mold portion and a lower mold portion, wherein the lower mold portion is arranged below a portion of the package board on which the at least one semiconductor chip is mounted, but not arranged below portions of the package board near edges of the package board,
   wherein the lower mold portion is connected to the upper mold portion through the at least one hole, and
   wherein the at least one hole comprises two or more holes, and wherein the at least one semiconductor chip comprises two or more lower semiconductor chips, wherein each of the lower semiconductor chips is mounted so as to overlap a corresponding one of the two or more holes, and wherein the lower mold portion is arranged below a portion of the package board in regions where the lower semiconductor chips are mounted but not below portions of the package board between the lower semiconductor chips.

15. The semiconductor package of claim 14, wherein the at least one semiconductor chip comprises a plurality of stacked semiconductor chips arranged one on top of the other and having at least one through via to electrically connect with each other or the package board.

16. The semiconductor package of claim 15, wherein a width of a bottom one of the stacked semiconductor ships is different from a width of the other ones of the stacked semiconductor chips.

17. A semiconductor package comprising:
   a package board comprising at least one hole formed therethrough;
   at least one semiconductor chip flip chip mounted on the package board so as to overlap the at least one hole; and
   a mold layer having an upper mold portion and a lower mold portion, wherein the lower mold portion is arranged below a portion of the package board on which the at least one semiconductor chip is mounted, but not arranged below portions of the package board near edges of the package board, and
   wherein the lower mold portion is connected to the upper mold portion through the at least one hole, and
   wherein the lower mold portion comprises:
   a center pattern overlapped by the hole; and
   at least one edge pattern spaced apart from the center pattern with at least one of lower solder balls disposed therebetween.

* * * * *